(12) United States Patent
Bang et al.

(10) Patent No.: US 7,804,153 B2
(45) Date of Patent: Sep. 28, 2010

(54) SEMICONDUCTOR DEVICE PREVENTING BRIDGE BETWEEN FUSE PATTERN AND GUARD RING

(75) Inventors: Kwang-kyu Bang, Suwon-si (KR); Jun-ho Jang, Suwon-si (KR); Yoo-mi Lee, Songpa-gu (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 281 days.

(21) Appl. No.: 11/843,777

(22) Filed: Aug. 23, 2007

(65) Prior Publication Data

US 2008/0093705 A1 Apr. 24, 2008

(30) Foreign Application Priority Data

Oct. 18, 2006 (KR) .................. 10-2006-0101560

(51) Int. Cl.
*H01L 23/62* (2006.01)
(52) U.S. Cl. .............. 257/529; 257/50; 257/209; 257/530; 257/E23.147; 438/132
(58) Field of Classification Search .......... 438/132; 257/E23.15, 50, 209, 529, 530, E23.149, 257/E23.147, E21.592
See application file for complete search history.

(56) References Cited

U.S. PATENT DOCUMENTS

| 6,100,118 A | * | 8/2000 | Shih et al. | ............ 438/132 |
| 6,753,210 B2 | * | 6/2004 | Jeng et al. | ............ 438/132 |
| 2004/0053487 A1 | * | 3/2004 | Jeng et al. | ............ 438/601 |
| 2007/0172995 A1 | * | 7/2007 | Choi | ............ 438/132 |

FOREIGN PATENT DOCUMENTS

| JP | 63244644 | 10/1988 |
| KR | 1020010066336 A | 7/2001 |
| KR | 1020020094889 A | 12/2002 |
| KR | 1020040084471 A | 10/2004 |
| KR | 1020060011634 A | 2/2006 |

* cited by examiner

*Primary Examiner*—Zandra Smith
*Assistant Examiner*—Tsz K Chiu
(74) *Attorney, Agent, or Firm*—Volentine & Whitt, PLLC

(57) ABSTRACT

A semiconductor device having a fuse structure that can prevent a bridge between a fuse pattern and a guard ring, and a method of fabricating the same are provided. The fuse pattern formed on a multiple-layered metal interconnect layer is stepped shape increasing a vertical distance between the fuse pattern and the guard ring.

16 Claims, 5 Drawing Sheets

SEMICONDUCTOR DEVICE PREVENTING BRIDGE BETWEEN FUSE PATTERN AND GUARD RING

CROSS-REFERENCE TO RELATED PATENT APPLICATION

This application claims the benefit of Korean Patent Application No. 10-2006-0101560, filed on Oct. 18, 2006, the subject matter of which is hereby incorporated by reference.

BACKGROUND OF THE INVENTION

1. Field of the Invention

The present invention relates to a semiconductor device. More particularly, the invention relates to a fuse box incorporated within a semiconductor device and a method of fabricating same.

2. Description of the Related Art

The development of contemporary semiconductor memory devices is characterized by ever increasing integration density. As the size of individual components and elements shrinks and as elements and components are placed closer and closer together the risk of fabrication defects increases. That is, as the separating margins between adjacent elements and components decreases in densely integrated semiconductor devices, the risk of fabrication errors causing critical operating defects increases. Such defects reduce manufacturing yields and negatively impact profitability of manufacturing operations.

One approach to mitigating the effect of increased fabrication defects is the provision of certain redundancy circuits. This is particularly true for semiconductor memory devices which include a large number of identical memory cells. If one memory cell within a memory cell array is non-operative due to a fabrication defect, a redundant memory cell selected from a group of redundant memory cells (i.e., a redundancy circuit) may be used in its place.

A common approach to replacing a defective cell with a redundant cell begins by running a test routine for all memory cells in an array. Once located, a defective memory cell is replaced by a redundant memory cell by cutting a corresponding fuse within a fuse box associated with the memory array. Fuse cutting may be accomplished using a laser. This approach has provided so successful that redundant memory cell arrays and associated fuse boxes are routinely incorporated into contemporary semiconductor memory devices.

Many contemporary semiconductor devices are also characterized by the incorporation of a final passivation layer (e.g., a silicon nitride layer having a hard layer quality) formed on an outermost side portion of the device. This final passivation layer protects the internal semiconductor elements and components from externally applied mechanical impacts and the intrusion of moisture and contaminates.

However, the final passivation layer and certain intervening insulating layers formed on the fuse box must be removed during fuse cutting operations. Removing the final passivation layer may expose, for example, interlayer insulating layers to the external environment. Some commonly used interlayer insulating layers such as silicon oxide are quite vulnerable to the effects of humidity. Thus, when the humidity permeates such interlayer insulating layers, internal interconnects may erode to the point where the reliability of the semiconductor device can not be assured. In order to block humidity permeation through interlayer insulating layers exposed during fuse cutting operations, a metal guard ring is formed around a fuse opening through which fuse cutting operations are performed.

Along with other elements and components of contemporary semiconductor devices, the pitch separating adjacent fuses has been decreased with increased integration. Thus, an adjacent fuse may be damaged during a fuse cutting operation if the intensity of the cutting laser is too great. Alternately, if the intensity of the cutting laser is too weak, the intended fuse will not be cut. As a remedy to the problems associated with accurate application of a cutting laser, the interlayer insulating layers overlaying the fuse box opening are over-etched with removal of the final passivation layer prior to fuse cutting operations, so that an upper portion of a metal layer forming the fuse pattern is also partially removed to decrease the height of the fuse pattern.

However, when the interlayer insulating layers are over-etched to decrease the height of the fuse pattern, the metal guard ring may become exposed. When the guard ring is exposed, melted metal portions of the cut fuse may contact and adhere to the guard ring. Such splatter protrusions may form a conductive bridge between a fuse in the fuse box and the guard ring. Figure (FIG.) 1 is a photograph showing a bridge (i.e., the same protrusion shown in the circle) produced between the fuse pattern and the guard ring by a fuse cutting operation. Because the guard ring is formed from a conductive metal, the cut fuse which is intended to form an open circuit may, in fact, be electrically connected through the bridge and the guard ring to an unintended circuit. This erroneous "connection" may cause a serious malfunction with the redundancy circuit.

SUMMARY OF THE INVENTION

Embodiments of the invention provide a semiconductor device having a fuse structure better configured to avoid the possible formation of a bridge between a fuse and an associated guard ring. Embodiments of the invention also provide a method of fabricating a semiconductor device such that its constituent fuse structure better prevents formation of a bridge between a fuse and a guard ring.

In one embodiment, the invention provides a semiconductor device formed on a semiconductor substrate, comprising; a stepped fuse pattern including bottom portion and rising sidewall portions wherein the bottom portion is configured to receive laser radiation during a fuse cutting operation, a fuse opening exposing the fuse pattern through an interlayer insulating layer and a passivation layer formed on the interlayer insulating layer, and a guard ring surrounding the fuse opening, wherein at least a portion of the guard ring is formed within the interlayer insulating layer.

In another embodiment, the invention provides a method of fabricating a semiconductor device, comprising; forming a first interlayer insulating layer on a semiconductor substrate, forming a first metal contact through the first interlayer insulating layer, forming a metal layer on the first interlayer insulating layer and patterning the metal layer to form a stepped fuse pattern including bottom portion and rising sidewall portions, wherein the bottom portion is configured to receive laser radiation during a fuse cutting operation, and a first metal pattern electrically contacting the first metal contact, forming a second insulating layer on the first interlayer insulating layer, the first metal pattern, and the fuse pattern, forming a second metal contact through the second insulating layer, forming a second metal pattern on the second insulating layer in contact with the second metal contact, forming a passivation layer on the second metal pattern, and etching the passivation layer and the second insulating layer to form a fuse opening exposing the fuse pattern.

BRIEF DESCRIPTION OF THE DRAWINGS

Embodiments of the invention will be described with reference to the attached drawings in which.

DESCRIPTION OF EMBODIMENTS

Figure 1:
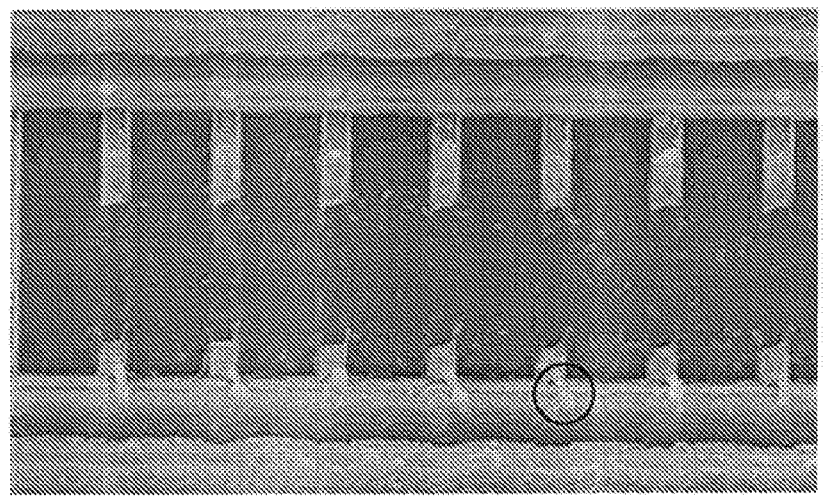
FIG. 1 is a photograph showing a bridge produced between a fuse pattern and a guard ring after fuse cutting.

The present invention will now be described more fully with reference to the accompanying drawings, in which exemplary embodiments of the invention are shown. The invention may, however, be embodied in many different forms and should not be construed as being limited to only the embodiments set forth herein. Rather, the embodiments are provided as teaching examples. In the drawings, the relative thickness of various layers and the relative size and shape of various regions may be exaggerated or abstracted for clarity of explanation.

Figure 2:
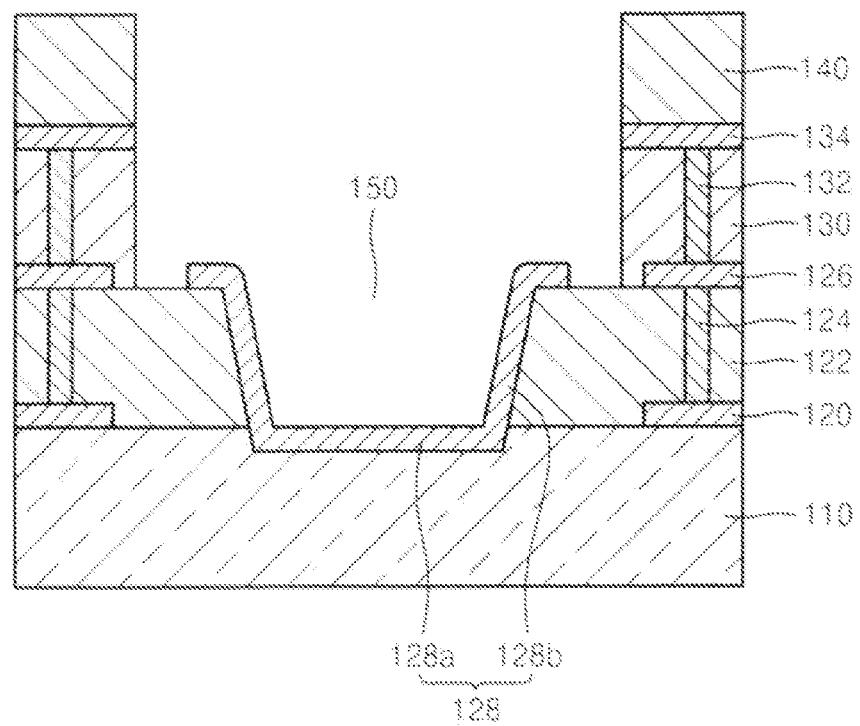
FIG. 2 is a sectional view illustrating a semiconductor device having a fuse pattern with steps according to an embodiment of the present invention.

FIG. 2 is a sectional view illustrating a semiconductor device having a stepped fuse pattern according to an embodiment of the invention. In the semiconductor device illustrated in FIG. 2, a fuse pattern 128 is exposed by a fuse opening 150. As shown in FIG. 2, fuse pattern 128 is formed in a trench pattern having steps. During a fuse cutting operation, a laser may be irradiated onto a bottom portion of the trench-shaped fuse pattern 128. Although not illustrated in FIG. 2, fuse pattern 128 may be connected to an underlying fuse bit line via a contact in conventional form. Fuse pattern 128 may be connected to an underlying fuse bit line, so that fuse pattern 128 may be formed with a trench shape of fixed length without extending lengthwise.

A first metal pattern 126 surrounding fuse opening 150 is formed on a common lateral layer with fuse pattern 128. (The term "lateral layer" has reference to a lateral strata positioning extending at approximately the same vertical elevation above the substrate). First metal pattern 126 constitutes a portion of a guard ring. Fuse pattern 128 and first metal pattern 126 may be formed on a first metal interconnect layer which is part of a multi-layered interconnect layer. Since fuse pattern 128 is a pattern with a fixed length, a portion of the guard ring surrounding fuse pattern 128 may be formed on the same lateral layer as fuse pattern 128.

A second contact 132 and a second metal pattern 134 are formed on first metal pattern 126. First metal pattern 126, second contact 132 and second metal pattern 134 surround fuse opening 150, and form an effective guard ring preventing the permeation of moisture through insulating layers 122 and 130, which are exposed by fuse opening 150.

In FIG. 2, a first contact 124 additionally acts as part of the guard ring surrounding fuse pattern 128. First contact 124 is formed through first insulating layer 122 to contact a lower pattern (e.g., a patterned polysilicon layer) 120. All of the foregoing is formed on a semiconductor substrate 110 with a passivation layer 140 formed to protect the underlying elements and layers.

Fuse opening 150 exposes fuse pattern 128 to a cutting laser. This is because an upper surface of fuse pattern 128 is partially etched by the process removing the insulating layers otherwise covering fuse pattern 128 the effective "cutting height" of fuse pattern 128 is substantially reduced. With its height reduced fuse pattern 128 may be more easily and accurately cut with a laser. However, as fuse opening portion 150 is widened by over-etching of the insulating layers, portions of the guard ring surrounding fuse opening 150, especially upper portions of the guard ring may be partially exposed.

For example, as conventionally implemented, if fuse pattern 128 is formed from aluminum, portions cut by an applied laser may roll up or splatter out to form a bridge between (e.g.,) second metal pattern 134 and the cut fuse pattern. However, if fuse pattern 128 is implemented according to an embodiment of the invention, only bottom portion 128a of fuse pattern 128 will substantially receive laser radiation. As a result, the portion of fuse pattern 128 actually receiving laser radiation is distanced further away from second metal pattern 134, thereby preventing the formation of a bridge between fuse pattern 128 and second metal pattern 134. Sidewall portions 128b of fuse pattern 128 do not substantially receive laser radiation.

FIGS. 3A through 3H are related cross sectional views sequentially illustrating a method of fabricating a semiconductor device having a stepped fuse pattern according to an embodiment of the invention.

Figure 3A:
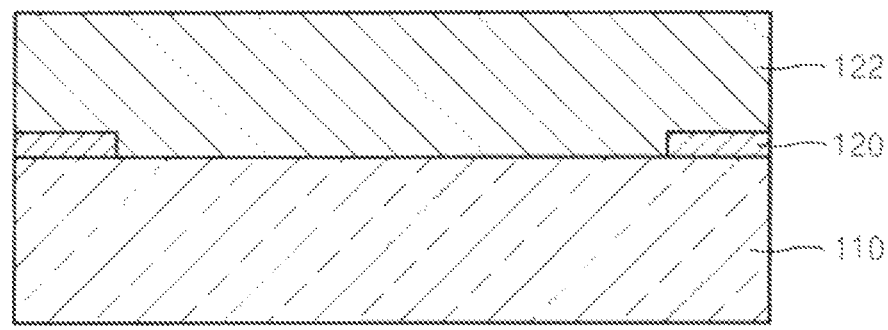
FIGS. 3A through 3I are sectional views illustrating a method of fabricating a semiconductor device having a fuse pattern with steps according to another embodiment of the present invention.

Referring to FIG. 3A, a first insulating layer 122 is formed on a semiconductor substrate 110 on which a lower pattern 120 (e.g., patterned polysilicon) is formed. Semiconductor substrate 110 will also include other components and elements (not shown) such as bit lines, word lines and capacitors, etc.

Figure 3B:
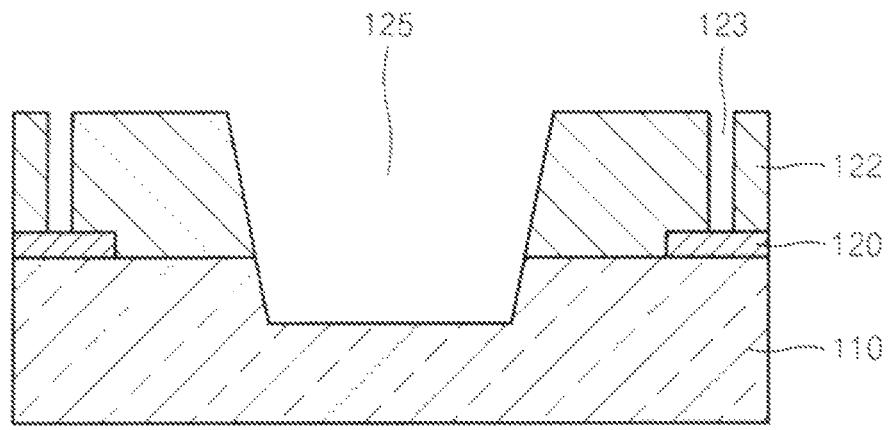

Referring to FIG. 3B, a first contact hole 123 and a trench 125 are formed in first insulating layer 122 using conventional photolithography processes. Trench 125 is formed with a desired stepped pattern that will largely determine the shape of the fuse pattern consequently formed. First contact hole 123 will be used to form a portion of a guard ring surrounding the fuse pattern. Trench 125 will be formed as a pattern having a regular width, length and depth. First contact hole 123 is formed to expose lower pattern 120. In certain embodiments of the invention, lower pattern 120 forms a portion of the guard ring. Lower pattern 120 may be used as an etch stop, but since it does not exist in the region in which trench 125 is formed, trench 125 may be formed with a depth greater than first contact hole 123. However, the desired depth of trench 125 may be adjusted by defining its etching conditions, as is well understood in the art.

Figure 3C:
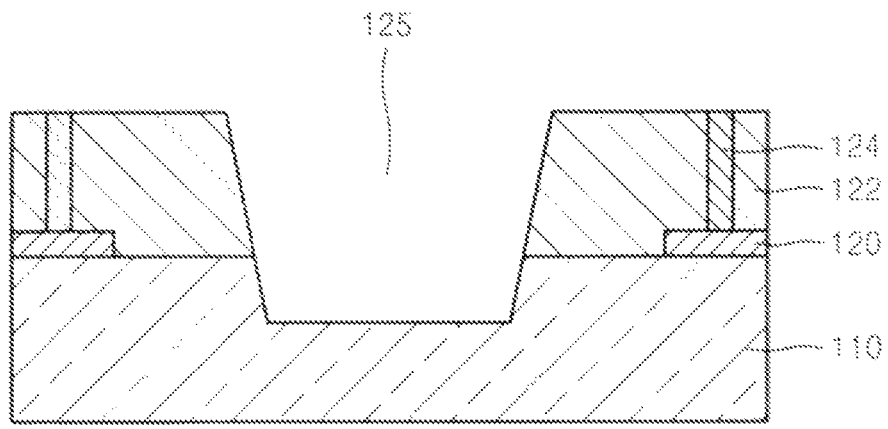

Referring to FIG. 3C, first contact hole 123 is filled with a metal layer to form a first contact 124. In this case, trench 125 is shielded by a mask, such as photoresist, so that only first contact hole 123 is filled with metal.

Figure 3D:
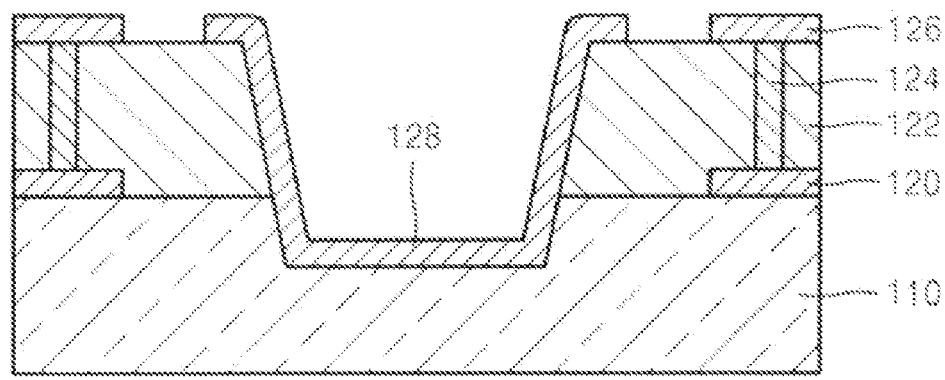

Referring to FIG. 3D, a metal layer is deposited and patterned on first insulating layer 122 including first contact 124 formed therein, thereby forming a fuse pattern 128 and a first metal pattern 126. Fuse pattern 128 is formed across bottom and sidewall surfaces of trench 125, and on an upper surface of first insulating layer 122. First metal layer 126 electrically contacts first contact 124 and forms a portion of the guard ring. In the illustrated embodiment, fuse pattern 128 and first metal pattern 126 may be formed together from a single metal layer out or a multiple-layered interconnect structure. Fuse pattern 128 and first metal pattern 126 may be formed from, (e.g.,) aluminum or an aluminum alloy.

Figure 3E:
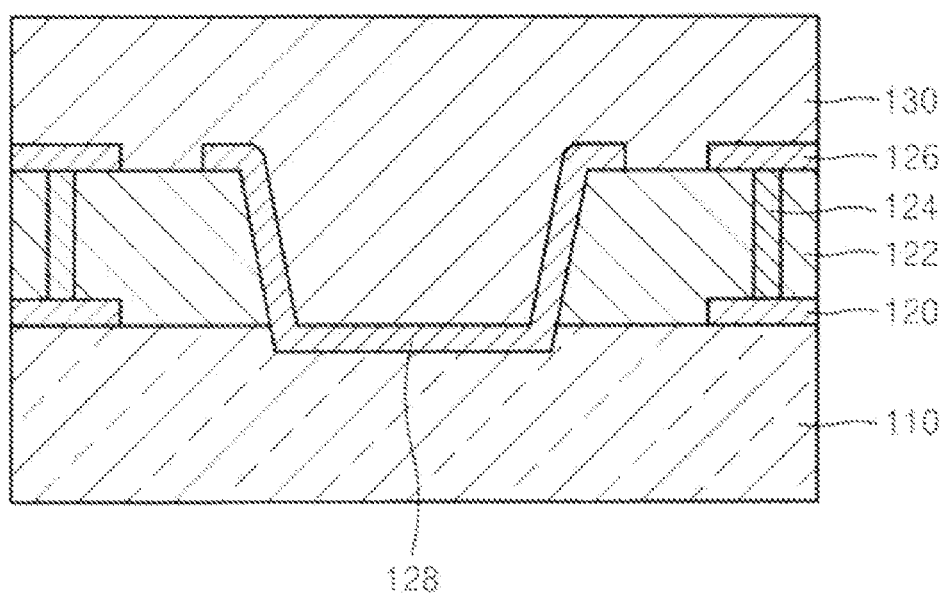

Referring to FIG. 3E, a second insulating layer 130 is formed on semiconductor substrate 110 including fuse pattern 128 and first metal pattern 126. Second insulating layer 130 may serve as an inter-metal insulating layer, and may be composed of silicon oxide, such as fluoride silicate glass (FSG) and phosphor silicate glass (PSG).

Figure 3F:
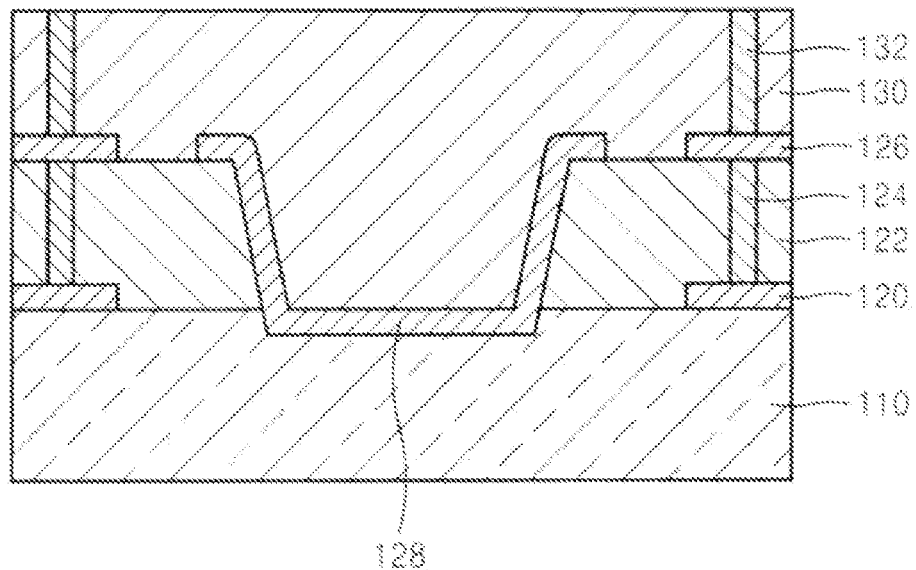

Referring to FIG. 3F, a second contact 132 is formed through second insulating layer 130 to expose first metal pattern 126. Second contact 132 may be formed by burying a metal layer, (e.g., tungsten and/or aluminum) after forming a second contact hole via conventional photolithography techniques. Second contact 132 forms a portion of the guard ring surrounding fuse pattern 1128 along with first metal pattern 126. Second contact 132 prevents moisture permeation through second insulating layer 130 exposed during a fuse cutting operation.

Figure 3G:
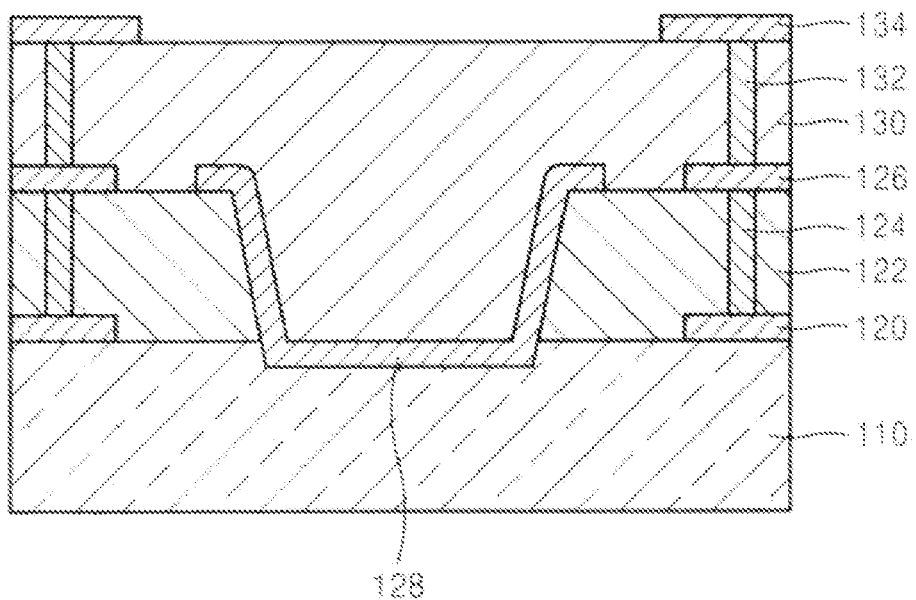

Referring to FIG. 3G, a second metal pattern 134 is formed on second insulating layer 130 in electrical contact with second contact 132. Second metal pattern 134 may be formed from aluminum like first metal pattern 126. Second metal pattern 134 forms a portion of the guard ring together with lower pattern 120, first contact 124, first metal pattern 126 and second contact 132. Also, second metal pattern 134 may be formed wider than first metal pattern 126 to be closer to the fuse opening subsequently formed in order to act as an upper roof of the guard ring.

Figure 3H:
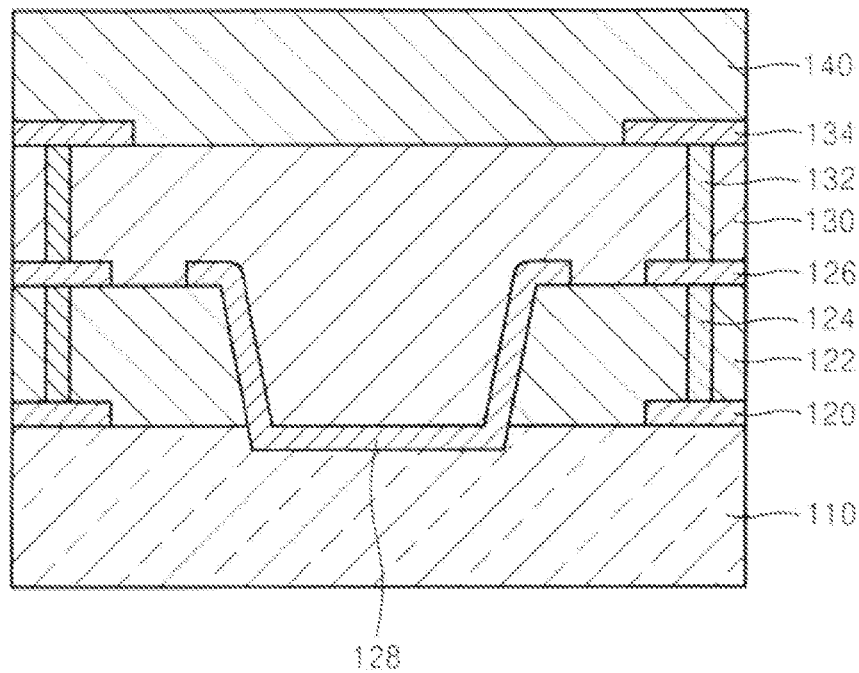

Referring to FIG. 3H, a passivation layer 140 is formed on semiconductor substrate 110 including second metal pattern 134. Passivation layer 140 may be a silicon nitride layer. Optionally, a third insulating layer (not shown) may be formed on second metal pattern 134 under passivation layer 140.

Figure 3I:
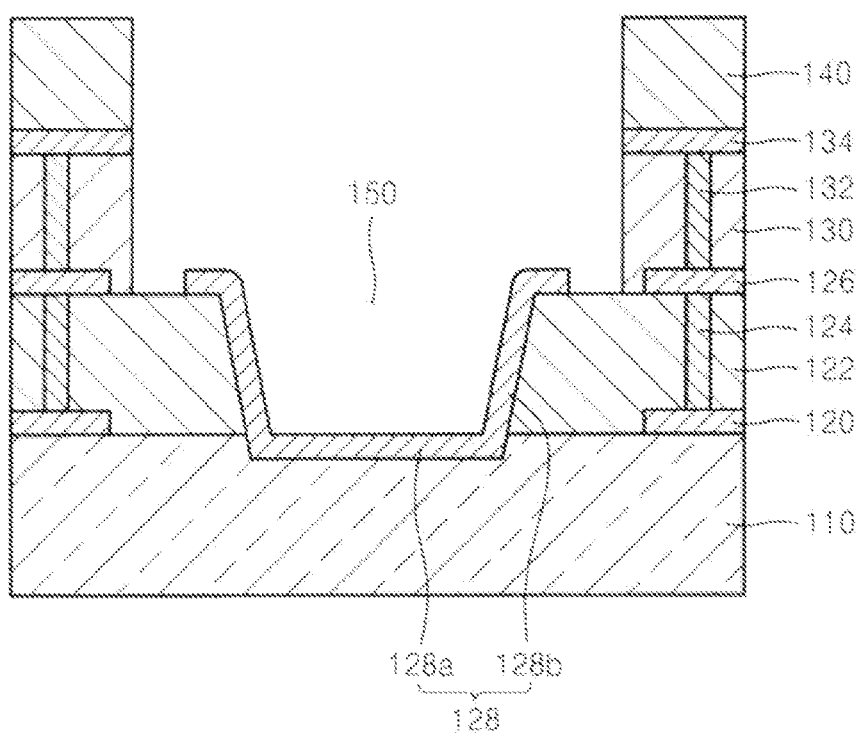

Referring to FIG. 3I, a fuse opening 150 is formed to expose fuse pattern 128. Fuse opening portion 150 may be formed by etching passivation layer 140, second insulating layer 130 and first insulating layer 122, using a photoresist pattern (not shown) as a etch mask. In this case, an upper surface of fuse pattern 128 may be etched during over-etching of first insulating layer 122, so that a height of fuse pattern 128 is decreased.

A laser beams may be radiated onto the exposed bottom surface of fuse pattern 128 through fuse opening 150 during a fuse cutting operation. Since this portion of fuse pattern 128 is located further away from second metal pattern 134 forming part of the guard ring, any metal portion (e.g., aluminum) rolling upward or spattering away from fuse pattern 128 during the cutting process is significantly less likely to form a bridge between second metal pattern 134 and the cut fuse pattern 128.

According to another embodiment of the present invention, a fuse pattern may be formed together with an upper metal interconnect layer such as the second or third metal interconnect layer. In this case, a trench for forming steps of the fuse pattern may be simultaneously formed with a second contact (a first via) or a third contact (a second via).

According to embodiments of the invention, when forming a fuse pattern within a metal interconnect layer, the fuse pattern may be formed with a stepped pattern including a bottom portion and sidewall portions. Thus, the effective distance between the fuse pattern and commonly exposed guard ring portions is increased, thereby preventing a bridge from forming between the fuse pattern and the guard ring during a fuse cutting operation.

This type of stepped fuse pattern may be formed using a trench of defined geometry during the same metallization process used to form a contact or a via without using an additional mask, thereby simplifying the overall fabrication process.

While the present invention has been particularly shown and described with reference to exemplary embodiments thereof, it will be understood by those of ordinary skill in the art that various changes in form and details may be made therein without departing from the scope of the present invention as defined by the following claims.

What is claimed is:

1. A semiconductor device formed on a semiconductor substrate, comprising:
 a first interlayer insulating layer formed on a substrate and having a lower surface and an upper surface;
 a second interlayer insulating layer formed on the first interlayer insulating layer;
 a trench formed though the first interlayer insulating layer and having a trench bottom and opposing trench sidewalls;
 a stepped fuse pattern formed on the trench bottom and opposing trench sidewalls, such that the stepped fuse pattern comprises a bottom portion extending along the trench bottom and rising sidewall portions formed respectively on the trench sidewalls, wherein each sidewall portion comprises a lower end disposed at the trench bottom and an upper end disposed on the upper surface of the first interlayer insulating layer, such that only the bottom portion of the stepped fuse pattern is configured to receive laser radiation during a fuse cutting operation;
 a fuse opening exposing the fuse pattern through the second interlayer insulating layer; and
 a guard ring surrounding the fuse opening, wherein the guard ring comprises metal patterns formed on the first interlayer insulating layer and formed on the second interlayer insulating layer, and the fuse opening exposes a portion of the metal patterns.

2. The semiconductor device of claim 1, wherein the guard ring comprises:
 a lower pattern formed on the substrate at a first level under the first interlayer insulating layer;
 a first metal pattern formed on the upper surface of the first interlayer insulating layer at a second level above the first level; and,
 a first contact extending through the first interlayer insulating layer to electrically connect the first metal pattern and the lower pattern,
 wherein the sidewall portions of the stepped fuse pattern extend from the first level to the second level.

3. The semiconductor device of claim 2, wherein the first metal pattern and upper ends of the sidewall portions of the stepped fuse pattern are formed on a same level.

4. The semiconductor device of claim 2, wherein the guard ring further comprises:
 a second metal pattern formed on an upper surface of the second interlayer insulating layer at a third level above the second level; and
 a second contact extending through the second interlayer insulating layer to electrically connect the second metal pattern and the first metal pattern.

5. The semiconductor device of claim 1, wherein the stepped fuse pattern is formed from at least one material selected from a group consisting of aluminum, polysilicon and tungsten.

6. The semiconductor device of claim 1, wherein the fuse opening exposes a portion of the guard ring.

7. The semiconductor device of claim 4, wherein the fuse opening further exposes a portion of the second metal pattern.

8. The semiconductor device of claim 7, wherein the second metal pattern is formed on the second interlayer insulating layer with a width greater than the width of the first metal pattern formed on the first interlayer insulating layer.

9. A semiconductor device formed on a semiconductor substrate, comprising:
- a first interlayer insulating layer formed on a substrate and having a lower surface and an upper surface;
- a second interlayer insulating layer formed on the first interlayer insulating layer;
- a passivation layer formed on the second interlayer insulating layer;
- a trench formed though the first interlayer insulating layer and having a trench bottom and opposing trench sidewalls;
- a stepped fuse pattern formed on the trench bottom and opposing trench sidewalls, such that the stepped fuse pattern comprises a bottom portion extending along the trench bottom and rising sidewall portions formed respectively on the trench sidewalls, wherein each sidewall portion comprises a lower end disposed at the trench bottom and an upper end disposed on the upper surface of the first interlayer insulating layer, such that only the bottom portion of the stepped fuse pattern is configured to receive laser radiation during a fuse cutting operation;
- a fuse opening exposing the fuse pattern through the second interlayer insulating layer and the passivation layer; and
- a guard ring surrounding the fuse opening, wherein the guard ring comprises metal patterns formed on the first interlayer insulating layer and on the second interlayer insulating layer, and the fuse opening exposes a portion of the metal patterns.

10. The semiconductor device of claim 9, wherein the guard ring comprises:
- a lower pattern formed on the substrate at a first level under the first interlayer insulating layer;
- a first metal pattern formed on the upper surface of the first interlayer insulating layer at a second level above the first level; and
- a first contact extending through the first interlayer insulating layer to electrically connect the first metal pattern and the lower pattern,
- wherein the sidewall portions of the stepped fuse pattern extend from the first level to the second level.

11. The semiconductor device of claim 10, wherein the first metal pattern and upper ends of the sidewall portions of the stepped fuse pattern are formed on a same level.

12. The semiconductor device of claim 10, wherein the guard ring further comprises:
- a second metal pattern formed on an upper surface of the second interlayer insulating layer at a third level above the second level; and
- a second contact extending through the second interlayer insulating layer to electrically connect the second metal pattern and the first metal pattern.

13. The semiconductor device of claim 9, wherein the stepped fuse pattern is formed from at least one material selected from a group consisting of aluminum, polysilicon and tungsten.

14. The semiconductor device of claim 9, wherein the fuse opening exposes a portion of the guard ring.

15. The semiconductor device of claim 12, wherein the fuse opening exposes a portion of the second metal pattern.

16. The semiconductor device of claim 15, wherein the second metal pattern is formed on the second interlayer insulating layer with a width greater than the width of the first metal pattern formed on the first interlayer insulating layer.

* * * * *